United States Patent
Goodwin-Johansson et al.

(10) Patent No.: US 6,590,267 B1
(45) Date of Patent: Jul. 8, 2003

(54) MICROELECTROMECHANICAL FLEXIBLE MEMBRANE ELECTROSTATIC VALVE DEVICE AND RELATED FABRICATION METHODS

(75) Inventors: Scott H. Goodwin-Johansson, Pittsboro, NC (US); Gary E. McGuire, Chapel Hill, NC (US)

(73) Assignee: MCNC, Research Triangle Park, NC (US)

( * ) Notice: Subject to any disclaimer, the term of this patent is extended or adjusted under 35 U.S.C. 154(b) by 0 days.

(21) Appl. No.: 09/661,997

(22) Filed: Sep. 14, 2000

(51) Int. Cl.⁷ ................................................. H01L 29/78

(52) U.S. Cl. ....................................... 257/415; 257/414

(58) Field of Search .................................. 257/414, 415

(56) References Cited

U.S. PATENT DOCUMENTS

| | | | |
|---|---|---|---|
| 2,851,618 A | 9/1958 | Krawinkel | |
| 2,927,255 A | 3/1960 | Diesel | |
| 2,942,077 A | 6/1960 | Diesel | |

(List continued on next page.)

FOREIGN PATENT DOCUMENTS

| | | |
|---|---|---|
| CH | 677136 A5 | 4/1991 |
| DE | 4235593 A1 | 10/1993 |
| EP | 0 435 237 A1 | 7/1991 |
| EP | 469749 A1 | 2/1992 |
| EP | 478956 A3 | 4/1992 |
| EP | 665590 A2 | 8/1995 |
| EP | 0 829 649 A2 | 3/1998 |
| EP | 834759 A2 | 4/1998 |
| GB | 2 334 000 A | 8/1999 |

OTHER PUBLICATIONS

Deng et al., *The Development of Polysilicon Micromotors for Optical Scanning Applications* (No date).

Legtenberg et al., *Electrostatic Curved Electrode Actuators*, Micro Electro Mechanical Systems (Jan.–Feb. 1995), pp. 37–42, IEEE.

(List continued on next page.)

*Primary Examiner*—Stephen D. Meier
(74) *Attorney, Agent, or Firm*—Alston & Bird LLP

(57) ABSTRACT

A MEMS (Micro Electro Mechanical System) valve device driven by electrostatic forces is provided. This valve device can provide for fast actuation, large valve force and large displacements while utilizing minimal power. The MEMS valve device includes a substrate having an aperture formed therein, a substrate electrode, a moveable membrane that overlies the aperture and has an electrode element and a biasing element. Additionally, at least one resiliently compressible dielectric layer is provided to insure electrical isolation between the substrate electrode and electrode element of the moveable membrane. In operation, a voltage differential is established between the substrate electrode and the electrode element of the moveable membrane to move the membrane relative to the aperture to thereby controllably adjust the portion of the aperture that is covered by the membrane. Additional embodiments provide for the resiliently compressible dielectric layer to be formed on either or both the substrate electrode and the moveable membrane and provide for either or both the valve seat surface and the valve seal surface. In yet another embodiment the resiliently compressible dielectric layer(s) have a textured surface; either at the valve seat, the valve seal or at both surfaces. In another embodiment of the invention a pressure-relieving aperture is defined within the substrate and is positioned to underlie the moveable membrane. Alternatively, additional embodiments of the present invention provide for MEMS valve arrays driven by electrostatic forces. The MEMS valve array comprises a substrate having a plurality of apertures defined therein. A method for making the MEMS valve device is also provided.

28 Claims, 11 Drawing Sheets

U.S. PATENT DOCUMENTS

| | | |
|---|---|---|
| 3,772,537 A | 11/1973 | Clifford et al. |
| 3,796,976 A | 3/1974 | Heng et al. |
| 4,317,611 A | 3/1982 | Petersen |
| 4,516,091 A | 5/1985 | Sasser |
| 4,554,519 A | 11/1985 | Adam |
| 4,581,624 A | 4/1986 | O'Connor |
| 4,598,585 A | 7/1986 | Boxenhorn |
| 4,662,746 A | 5/1987 | Hornbeck |
| 4,692,727 A | 9/1987 | Wakino et al. |
| 4,710,732 A | 12/1987 | Hornbeck |
| 4,736,202 A | 4/1988 | Simpson et al. |
| 4,747,670 A | 5/1988 | Devio et al. |
| 4,789,803 A | 12/1988 | Jacobsen et al. |
| 4,794,370 A | 12/1988 | Simpson et al. |
| 4,826,131 A | 5/1989 | Mikkor |
| 4,857,757 A | 8/1989 | Sato et al. |
| 5,016,072 A | 5/1991 | Greiff |
| 5,043,043 A | 8/1991 | Howe et al. |
| 5,051,643 A | 9/1991 | Dworsky et al. |
| 5,061,049 A | 10/1991 | Hornbeck |
| 5,065,978 A | 11/1991 | Albarda et al. |
| 5,083,857 A | 1/1992 | Hornbeck |
| 5,097,354 A | 3/1992 | Goto |
| 5,164,688 A | 11/1992 | Larson |
| 5,168,249 A | 12/1992 | Larson |
| 5,172,262 A | 12/1992 | Hornbeck |
| 5,179,499 A | 1/1993 | MacDonald et al. |
| 5,202,785 A | 4/1993 | Nelson |
| 5,203,208 A | 4/1993 | Bernstein |
| 5,212,582 A | 5/1993 | Nelson |
| 5,233,459 A | 8/1993 | Bozler et al. |
| 5,258,591 A | 11/1993 | Buck |
| 5,260,596 A | 11/1993 | Dunn et al. |
| 5,268,696 A | 12/1993 | Buck et al. |
| 5,278,368 A | 1/1994 | Kasano et al. |
| 5,311,360 A | 5/1994 | Bloom et al. |
| 5,349,855 A | 9/1994 | Bernstein et al. |
| 5,353,656 A | 10/1994 | Hawkey et al. |
| 5,367,136 A | 11/1994 | Buck |
| 5,367,584 A | 11/1994 | Ghezzo et al. |
| 5,392,650 A | 2/1995 | O'Brien et al. |
| 5,408,355 A | 4/1995 | Rauch et al. |
| 5,408,877 A | 4/1995 | Greiff et al. |
| 5,441,597 A | 8/1995 | Bonne et al. |
| 5,479,042 A | 12/1995 | James et al. |
| 5,488,863 A | 2/1996 | Mochida et al. |
| 5,492,596 A | 2/1996 | Cho |
| 5,496,436 A | 3/1996 | Bernstein et al. |
| 5,507,911 A | 4/1996 | Greiff |
| 5,515,724 A | 5/1996 | Greiff et al. |
| 5,530,342 A | 6/1996 | Murphy |
| 5,535,902 A | 7/1996 | Greiff |
| 5,536,988 A | 7/1996 | Zhang et al. |
| 5,543,765 A | 8/1996 | Cachier |
| 5,544,001 A | 8/1996 | Ichiya et al. |
| 5,552,925 A | 9/1996 | Worley |
| 5,578,976 A | 11/1996 | Yao |
| 5,616,864 A | 4/1997 | Johnson et al. |
| 5,619,061 A | 4/1997 | Goldsmith et al. |
| 5,620,933 A | 4/1997 | James et al. |
| 5,627,396 A | 5/1997 | James et al. |
| 5,629,565 A | 5/1997 | Schlaak et al. |
| 5,629,790 A | 5/1997 | Neukerman et al. |
| 5,635,638 A | 6/1997 | Geen |
| 5,635,639 A | 6/1997 | Greiff et al. |
| 5,635,640 A | 6/1997 | Geen |
| 5,635,739 A | 6/1997 | Grieff et al. |
| 5,638,946 A | 6/1997 | Zavracky |
| 5,640,133 A | 6/1997 | MacDonald et al. |
| 5,644,177 A | 7/1997 | Guckel et al. |
| 5,650,568 A | 7/1997 | Greiff et al. |
| 5,652,374 A | 7/1997 | Chia et al. |
| 5,656,778 A | 8/1997 | Roszhart |
| 5,661,592 A | 8/1997 | Bornstein et al. |
| 5,666,258 A | 9/1997 | Gevatter et al. |
| 5,673,139 A | 9/1997 | Johnson |
| 5,673,785 A | 10/1997 | Schlaak et al. |
| 5,677,823 A | 10/1997 | Smith |
| 5,696,662 A | 12/1997 | Bauhahn |
| 5,723,894 A | 3/1998 | Ueno et al. |
| 5,759,870 A | 6/1998 | Yun et al. |
| 5,818,683 A | 10/1998 | Fujii |
| 5,862,003 A | 1/1999 | Saif et al. |
| 5,914,553 A | 6/1999 | Adams et al. |
| 6,032,923 A * | 3/2000 | Biegelsen et al. |
| 6,067,183 A | 5/2000 | Furlani et al. |
| 6,098,661 A * | 8/2000 | Yim et al. |
| 6,116,517 A | 9/2000 | Heinzl et al. |
| 6,116,863 A * | 9/2000 | Ahn et al. |
| 6,126,140 A * | 10/2000 | Johnson et al. |
| 6,127,908 A | 10/2000 | Bozler et al. |
| 6,168,395 B1 | 1/2001 | Quenzer et al. |
| 6,179,586 B1 | 1/2001 | Herb et al. |
| 6,223,088 B1 | 4/2001 | Scharnberg et al. |
| 6,227,824 B1 | 5/2001 | Stehr |
| 6,229,683 B1 | 5/2001 | Goodwin-Johansson |
| 6,229,684 B1 | 5/2001 | Cowen et al. |
| 6,236,491 B1 | 5/2001 | Goodwin-Johansson |

OTHER PUBLICATIONS

Elwenspoek et al., *Static and Dynamic Properties of Active Joints*, The 8th Annual Conference on Solid–State Sensors and Actuators, and Eurosensors (Jun. 1995), pp. 412–415.

Klaassen et al., *Silicon Fusion Bonding and Deep Reactive Ion Etching; A New Technology for Microstructures*, The 8th International Conference on Solid State Sensors and Actuators, and Eurosensors (Jun. 1995), pp. 556–559.

Walker et al., *A Silicon Optical Modulator with 5 MHz Operation for Fiber–in–the–Loop Applications*, The 8th International Conference on Solid–State Sensors and Actuators and Eurosensors, (Jun. 1995), Digest of Technical Papers, vol. 1, pp. 285–288.

Gunawan et al., *Micromachined Corner Cube Reflectors as a Communication Link*, Sensors and Actuators (1995), pp. 580–583.

Haji–Babaei et al., *Integrable Active Microvalve with Surface Micromachined Curled–Up Actuator*, International Conference on Solid–State Sensors and Actuators (Jun. 1997), pp. 833–836. IEEE.

Schiele et al., *Surface–Micromachined Electrostatic Microrelay* (1998), Sensors and Actuators A 66, Elsevier Science S.A.

Diem et al., *SOI (SIMOX) as a Substrate for Surface Micromachining of Single Crystalline Silicon Sensors and Actuators*, The 7th International Conference on Solid–State Sensors and Actuators (No date), pp. 233–236.

Jaecklin et al, *Mechanical and Optical Properties of Surface Micromachined Torsional Mirrors in Silicon, Polysilicon and Aluminum*, The 7th International Conference on Solid–State Sensors and Actuators (No date), pp. 958–961.

Petersen, *Silicon Torsional Scanning Mirror*, (Sep. 1980) IBM J. Res. Develop., vol. 24, No. 5.

Kleiman et al., *Single–Crystal High–Q Torsional Oscillators*, The American Institute of Physics (1985), pp. 2088–2091, Rev. Sci. Instrum. 58 (11).

Buser et al. *Very High Q–factor Resonators in Monocrystalline Silicon*, (1990), Sensors and Actuators, pp. 323–327.

Breng et al., *Electrostatic Micromechanic Actuators*, Micromechanical Microengineering 2 (1992), pp. 256–261, IOP Publishing Ltd., UK.

Elwenspoek et al., *Active Joints for Microrobot Limbs*, J. Micromechanical Microengineering 2 (1992), pp. 221–223, IOP Publishing Ltd., UK.

Jaecklin et al., *Optical Microshutters and Torsional Micromirrors for Light Modulator Arrays* (1993), IEEE.

Apte et al., *Deformable Grating Light Valves for High Resolution Displays*, Solid–State Sensor and Actuator Workshop, (Jun. 1994), pp. 1–6.

Storemnt et al., *Dry–Released Process for Aluminum Electrostatic Actuators*, Solid State Sensor and Actuator Workshop (Jun. 1994), pp. 95–98.

Petersen, *Single Crystal Silicon Actuators and Sensors Based On Silicon Fusion Bonding Technology*, Advanced Research Projects Agency, Semi–Annual Progress Report 1 (Jun. 1994), pp. 1–13, Lucas Nova Sensor, Fremont, California.

Petersen, *Single Crystal Silicon Actuators and Sensors Based On Silicon Fusion Bonding Technology*, Advanced Research Projects Agency, Semi–Annual Progress Report 2 (Jan. 1995), pp. 1–18, Lucas Nova Sensor, Fremont, California.

* cited by examiner

MICROELECTROMECHANICAL FLEXIBLE MEMBRANE ELECTROSTATIC VALVE DEVICE AND RELATED FABRICATION METHODS

FIELD OF THE INVENTION

The present invention relates to microelectromechanical system (MEMS) valve structures, and more particularly to low-power, high speed electrostatically actuating MEMS valve structures and the associated fabrication methods.

BACKGROUND OF THE INVENTION

Advances in thin film technology have enabled the development of sophisticated integrated circuits. This advanced semiconductor technology has also been leveraged to create MEMS (Micro Electro Mechanical System) structures. MEMS structures are typically capable of motion or applying force. Many different varieties of MEMS devices have been created, including microsensors, microgears, micromotors, and other microengineered devices. MEMS devices are being developed for a wide variety of applications because they provide the advantages of low cost, high reliability and extremely small size.

Design freedom afforded to engineers of MEMS devices has led to the development of various techniques and structures for providing the force necessary to cause the desired motion within microstructures. For example, microcantilevers have been used to apply rotational mechanical force to rotate micromachined springs and gears. Electromagnetic fields have been used to drive micromotors. Piezoelectric forces have also been successfully been used to controllably move micromachined structures. Controlled thermal expansion of actuators or other MEMS components has been used to create forces for driving microdevices. One such device is found in U.S. Pat. No. 5,475,318 entitled "Microprobe" issued Dec. 12, 1995 in the name of inventors Marcus et al., which leverages thermal expansion to move a microdevice. A micro cantilever is constructed from materials having different thermal coefficients of expansion. When heated, the bimorph layers arch differently, causing the micro cantilever to move accordingly. A similar mechanism is used to activate a micromachined thermal switch as described in U.S. Pat. No. 5,463,233 entitled "Micromachined Thermal Switch" issued Oct. 31, 1995 in the name of inventor Norling.

Electrostatic forces have also been used to move structures. Traditional electrostatic devices were constructed from laminated films cut from plastic or mylar materials. A flexible electrode was attached to the film, and another electrode was affixed to a base structure. Electrically energizing the respective electrodes created an electrostatic force attracting the electrodes to each other or repelling them from each other. A representative example of these devices is found in U.S. Pat. No. 4,266,339 entitled "Method for Making Rolling Electrode for Electrostatic Device" issued May 12, 1981 in the name of inventor Kalt. These devices work well for typical motive applications, but these devices cannot be constructed in dimensions suitable for miniaturized integrated circuits, biomedical applications, or MEMS structures.

MEMS electrostatic devices are used advantageously in various applications because of their extremely small size. Electrostatic forces due to the electric field between electrical charges can generate relatively large forces given the small electrode separations inherent in MEMS devices. An example of these devices can be found in U.S. patent application Ser. No. 09/345,300 entitled "ARC resistant High Voltage Micromachined Electrostatic Switch" filed on Jun. 30, 1999 in the name of inventor Goodwin-Johansson and U.S. patent application Ser. No. 09/320,891 entitled "Micromachined Electrostatic Actuator with Air Gap" filed on May 27, 1999 in the name of inventor Goodwin-Johansson. Both of these applications are assigned to MCNC, the assignee of the present invention.

Typical MEMS valves have employed thermal actuation/activation methods to control valves with high flow rates (i.e. large apertures and large clearance areas around the aperture). Thermal actuation has been preferred because it is able to provide the large forces necessary to control the valve over the requisite large distances. However, these valves have relatively slow operation rates due to the thermal time constraints related to the valve materials. Additionally, thermally activated MEMS valves use resistive heating where the power consumed is calculated by the current squared times the resistance and considerable power is consumed in operating the valve.

It would be advantageous to construct a MEMS valve device using electrostatic actuation that is capable of both large displacements and large forces. The electrostatic nature of the MEMS valve will allow for relatively low power consumption and, therefore, no unwarranted heating of the flowing gas or fluid would occur. Additionally, the electrostatic valve will provide for relatively fast operation, allowing for more precise control of the open and closed states of the valve. In addition, it would be advantageous to develop a MEMS valve that forms a secure valve seat to valve cover interface to assure low leakage rates are realized. It would also be beneficial to provide for a MEMS valve that minimizes the occurrence of stiction between the substrate and moveable membrane. Stiction, which is a well-known concept in microelectronics, is defined as the tendency for contacting MEMS surfaces to stick to one another. Stiction is especially a concern in valve devices in which a pressure differential exists across the closed valve. It would be beneficial to devise a MEMS valve that relieves the pressure differential prior to opening the valve.

As such, MEMS electrostatic valves that have improved performance characteristics are desired for many applications. For example, micromachined valves capable of fast actuation, large valve force and large valve flap displacements that utilize minimal power are desirable, but are currently unavailable.

SUMMARY OF THE INVENTION

The present invention provides for improved MEMS electrostatic valves that benefit from large valve force, fast actuation and large displacement of the moveable membrane to allow for the efficient transport of increased amounts of gas or liquid through the valve. Further, methods for making the MEMS electrostatic valve according to the present invention are provided.

A MEMS valve device driven by electrostatic forces according to the present invention comprises a planar substrate having an aperture formed therein and substrate electrode disposed on the planar substrate. Further, the MEMS valve device of the present invention includes a moveable membrane that overlies the aperture and has an electrode element and a biasing element. The moveable membrane is defined horizontally as having a fixed portion attached to the substrate and a distal portion that is moveable with respect the substrate. Additionally, at least one resiliently compressible dielectric layer is provided to insure electrical isolation between the substrate electrode and electrode element of the moveable membrane. In operation, a voltage differential is established between the substrate electrode and the electrode element of the moveable membrane to move the membrane relative to the aperture to thereby controllably adjust the portion of the aperture that is covered by the membrane.

In one embodiment of the MEMS valve device according to the present invention the resiliently compressible dielectric layer is formed on the substrate electrode and provides for the valve seat surface. In another embodiment of the present invention the resiliently compressible dielectric layer is formed on the moveable membrane and provides for the valve seal surface. In yet another embodiment resiliently compressible dielectric layers are formed on both the substrate electrode and the moveable membrane and provide for both the valve seat surface and the valve seal surface. The resiliently compressible nature of the dielectric layer allows for a secure closed valve to form that benefits from a low leakage rate.

In yet another embodiment the resiliently compressible dielectric layer has a textured surface; either at the valve seat, the valve seal or at both surfaces. By texturing these surfaces the valve is able to overcome stiction that causes the MEMS films to stick together after the electrostatic voltage is removed. In effect, texturing reduces the surface area around the valve seat to seal interface thereby reducing the effects of stiction. Additionally, texturing allows pressure to be advantageously used in easing the opening of the valve.

In another embodiment of the invention a pressure-relieving aperture is defined within the planar substrate and is positioned to underlie the moveable membrane. The pressure-relieving aperture provides a decrease in the pressure differential across the valve aperture by alleviating pressure prior to the opening of the valve.

Alternatively, another embodiment of the present invention provides for a MEMS valve array driven by electrostatic forces. The MEMS valve array comprises a planar substrate having a plurality of apertures defined therein and a substrate signal electrode disposed on the planar substrate. Further, the MEMS valve device of the present invention includes a moveable membrane that overlies the plurality of apertures and has an electrode element and a biasing element. The moveable membrane is defined horizontally as having a fixed portion attached to the substrate and a distal portion that is moveable with respect the substrate. Additionally, at least one resiliently compressible dielectric layer is provided to insure electrical isolation between the substrate electrode and electrode element of the moveable membrane. The array configuration allows for increased gas or liquid flows.

In one embodiment of the array, the substrate has a plurality of apertures and a plurality of moveable membranes is provided; wherein each aperture has a corresponding moveable membrane. In this manner, the electrode elements of the moveable membranes can be individually supplied electrostatic voltages, thus controlling the number of apertures opened or closed. This configuration effectuates a variable flow rate valve.

In another embodiment of the array, the substrate has a plurality of apertures and a plurality of substrate electrodes is provided; wherein each aperture has a corresponding substrate electrode. In this manner, the substrate electrodes can be individually supplied electrostatic voltages, thus controlling the number of apertures opened or closed. This configuration effectuates a variable flow rate valve.

Additionally, the array of the present invention is embodied in a substrate having a plurality of apertures and a shaped electrode element within the moveable membrane and/or the substrate. The shaped nature of the electrode element allows for the amount of membrane uncurling to be adjusted in accordance with the amount of voltage applied between the electrodes.

Alternately, another embodiment of the present invention provides a method for making the MEMS valve device described above. The method comprises the steps of etching the frontside of a substrate to define an aperture extending partially through the substrate, filling the aperture with a plug material, forming a membrane valve structure on the frontside of the substrate, removing the plug material, etching the backside of the valve aperture up to the release layer and removing the release layer to at least partially release the membrane from the substrate. The method provided allows for the alignment of the aperture and the substrate electrode to be accomplished on the frontside of the substrate.

As such the MEMS valve device driven by electrostatic force is capable of both large displacements and large forces. The electrostatic nature of the MEMS valve allows for relatively low power consumption and, therefore, no unwarranted heating of the flowing gas or fluid occurs. Additionally, the electrostatic valve will provide for relatively fast operation, allowing for faster cycle time and more precise control of the open and closed states. Furthermore, the MEMS valve provides for a secure valve seat to valve cover interface to assure low leakage rates. An additional benefit is realized in providing for a MEMS valve that minimizes the occurrence of stiction between the substrate and moveable membrane. Stiction is overcome by providing for textured surfaces at the valve seat and/or valve seal interface or allowing for a pressure-relieving aperture to be defined in the substrate. These and many more advantages can be realized with the MEMS valve device of the present invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
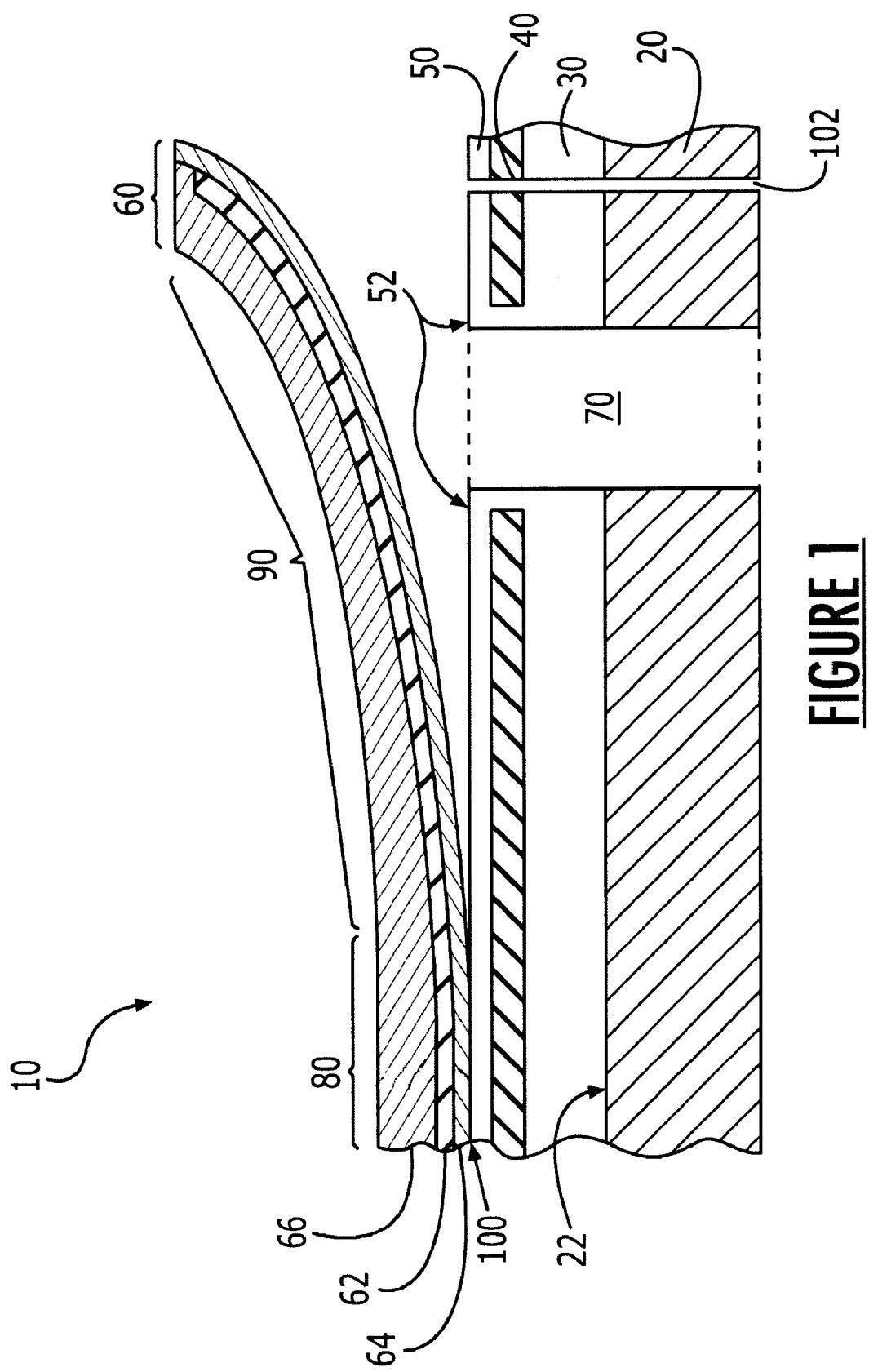
FIG. 1 is a cross-sectional view of a MEMS electrostatic valve in accordance with an embodiment of the present invention.
Figure 2:
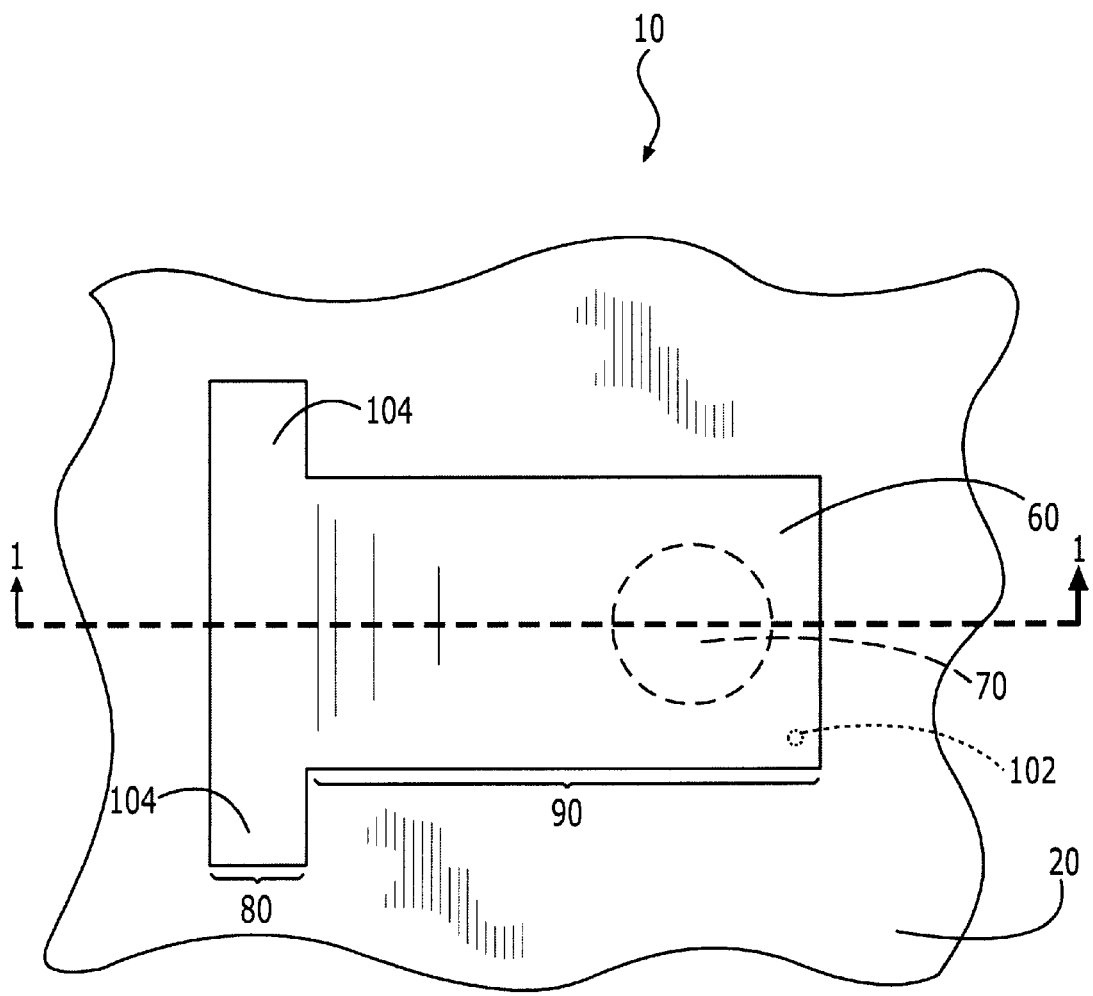
FIG. 2 is a top plan view of a MEMS electrostatic valve in accordance with an embodiment of the present invention.

Referring to FIGS. 1 and 2, a cross-sectional view (FIG. 1) and a top view of the substrate construct (FIG. 2) of an embodiment of the present invention provides a MEMS valve device 10 driven by electrostatic forces that can provide high and variable flow rates. As shown in FIG. 1, the layers of the MEMS valve device construct are arranged and shown vertically. In a first embodiment, an electrostatic MEMS valve device comprises in layers, a generally planar substrate 20, a substrate insulator 30, a substrate electrode 40, a substrate dielectric 50, and a moveable membrane 60. The substrate defines an aperture 70 formed therethrough that serves as the valve opening. In the embodiment shown the aperture is formed in cooperation with the substrate, the substrate insulator, the substrate electrode and the substrate dielectric. In this manner, the aperture may be formed through the substrate, the substrate insulator, the substrate electrode and/or the substrate dielectric. It is also possible and within the inventive concepts herein disclosed to form the aperture in various other configurations that allow for the flowable media (i.e. gas, liquid, light, etc.) to enter at one side of the substrate construct and exit at the opposite side of the substrate construct. Typically, the aperture will be cylindrical in shape. However, other shapes such as, a funnel shape having a smaller perimeter at the valve seat and a larger perimeter at the backside opening of the substrate, are also possible and within the breadth of the invention disclosed.

The movable membrane may be described as having two portions referred to as the fixed portion 80 and the distal portion 90. The portions are deposited horizontally along the length of the moveable membrane. The fixed portion is substantially affixed to the underlying substrate or intermediate layers at the attachment point 100. The distal portion is released from the underlying substrate or intermediate layers during fabrication of the MEMS valve device. During MEMS device operation the distal portion of the device is moveable with respect to the underlying substrate and substrate electrode. The movement of the distal portion thereby controllably adjusts the portion of the aperture covered by the moveable membrane.

In the FIG. 1 cross-sectional view, the moveable membrane 60 comprises multiple layers including at least one electrode element layer 62 and at least one biasing element layer 64 and/or 66. The biasing element(s) provide the moveable membrane with the biased shape shown in FIG. 1. Once the moveable membrane is released from the substrate during fabrication, the biasing element allows the overall membrane structure to position itself distant from the substrate. In the embodiment shown in FIG. 1 biasing provides for the upward curled shape of the moveable membrane. Biasing can be accomplished by providing for materials of dissimilar coefficients of thermal expansion, materials having substantive differences in cross-sectional thickness or other material characteristics may also effect biasing. The electrode element provides the moveable membrane with a means for electrostatic actuation. In valve operation a voltage is supplied to the electrode element and it is electrostatically attracted toward the substrate electrode. As the electrode element comes in contact with the substrate construct, the moveable membrane forms a valve seal that serves to seal-off the aperture formed in the substrate.

The electrostatic MEMS valve device, including the moveable membrane and underlying substrate layers, is constructed using known integrated circuit materials and microengineering techniques. Those skilled in the art will understand that different materials, various numbers of layers, and numerous arrangements of layers may also be used to form the underlying substrate layers and the moveable membrane. Although the MEMS valve device illustrated in the figures will be used as an example to describe manufacturing details, this discussion applies equally to all MEMS valve devices provided by the present invention unless otherwise noted.

Referring to FIGS. 1 and 2, a substrate 20 defines a generally planar surface 22 upon which the electrostatic MEMS valve device is constructed. Preferably the substrate comprises a microelectronic substrate, such as silicon, although any suitable substrate material having a generally planar surface can be used. The further processing steps involved in the fabrication of the present invention may be performed at relatively low temperatures and, therefore, the substrate that is used is not limited to conventional higher temperature substrates. By way of example, quartz, glass, or other suitable materials having insulating tendencies may serve as the substrate. A substrate insulator layer 30 typically overlies the planar surface of the substrate and provides electrical isolation. In certain embodiments that implement substrate materials having strong insulation characteristics it may be possible to form the MEMS valve device without the substrate insulator layer. The substrate insulator layer preferably comprises a non-oxidation-based insulator or polymer, such as polyimide or nitride. In this application, oxide based insulators are avoided if certain acids (such as hydrofluoric acid) are used in processing to remove the release layer. The substrate insulator layer is preferably formed by using a standard deposition technique, such as conventional spinning or low-pressure chemical vapor deposition (LPCVD), to deposit the insulating layer on the planar surface of the substrate.

A substrate electrode 40 is deposited as a generally planar layer affixed to at least a portion of the surface of the underlying substrate insulator layer 30 or substrate 20. The substrate electrode preferably comprises a gold layer deposited on the top surface of the insulator layer. If the substrate electrode is formed from a layer of gold, optionally a thin layer of chromium may be deposited prior to depositing the substrate signal electrode layer to allow better adhesion to the insulating layer and/or after the substrate signal electrode layer has been deposited to allow better adhesion to any subsequent adjacent materials. Alternatively, other suitable metallic or conductive materials may be used for the substrate signal electrode so long as release layer processing operations does not result in electrode erosion. Standard photolithography and etching techniques are typically used to deposit the electrode on the surface of the substrate.

Once the substrate electrode has been formed, preferably, a substrate dielectric layer 50 is deposited on the substrate electrode to provide for a dielectric that electrically isolates the substrate signal from the electrode element found in the moveable membrane. In embodiments that employ a substrate dielectric layer, this layer serves as the valve seat 52 that surrounds the valve aperture. In a preferred embodiment the substrate dielectric layer will comprise a resiliently compressible material. Resiliency for any given material can be assessed by comparing (a) the ratio of the electrostatic force of the valve around the aperture to the valve seat area (i.e. the applied pressure) versus (b) the product of Young's modulus (measure of elasticity) for the given material and the ratio of the surface roughness of the valve seat to the thickness of the valve seat. The resiliently compressible nature of the substrate dielectric layer will allow for the valve seat to deform upon contact with the moveable membrane. The deforming characteristic of the valve seat provides for a sound valve seal to form, thus providing for improved off-flow. One such resiliently compressable substrate dielectric material comprises polyimide, although other resiliently compressible dielectric insulators or polymers tolerant of release layer processing may also be used. The substrate dielectric layer is formed using a conventional deposition technique, such as standard spinning techniques or low-pressure chemical vapor deposition LPCVD.

The substrate dielectric layer 50 may be formed with a generally planar surface (as shown in FIG. 1) or the substrate dielectric layer may be formed with a textured surface. A textured surface at the valve seat 52 area may be preferred in those embodiments in which the moveable membrane "sticks" to the underlying substrate when release is desired. The MEMS phenomena related to the tendency of two mating MEMS surfaces to stick together is known in the art as stiction. By providing for a textured surface at the valve seat less surface area is contacting the moveable membrane when the valve seal is closed and thus less force is necessary to overcome the stiction. Textured surfaces are typically formed during fabrication and the implementation and fabrication of such surfaces is well known in the art.

A release layer (not shown in FIGS. 1 and 2), is deposited on the surface of the substrate dielectric layer 50 in the area generally underneath the distal portion of the overlying moveable membrane. The release layer is only deposited on those regions below moveable membrane portions not being affixed to the underlying substrate structure. Preferably, the release layer comprises an oxide or other suitable material that may be etched away when acid is applied thereto. After the overlying layers of the moveable membrane have been deposited on the substrate, the release layer may be removed through standard microengineering acidic etching techniques, such as a hydrofluoric acid etch. When the release layer has been removed, the distal portion 90 of moveable membrane 60 is separated from the underlying surface. The release of the moveable membrane from the substrate in conjunction with the biasing characteristics of the biasing element will typically result in the thin film membrane having a distal portion that has a curled shape. Biasing in the moveable membrane will typically result in the moveable membrane curling away from the substrate (as shown in FIG. 1) when no electrostatic force is applied. It is also possible to bias the moveable membrane such that it curls toward the substrate when no electrostatic force is applied.

Biasing in the moveable membrane may be accomplished by providing for biasing element and electrode element materials that differ in thickness, thermal coefficient of expansion or any other known biasing characteristic. Alternately, biasing may be induced during fabrication by employing process steps that create intrinsic stresses so as to curl the moveable membrane. For example, a polymeric biasing element can be deposited as a liquid and then cured by elevated temperatures so that it forms a solid biasing layer. Preferably, the biasing element may comprise a polymer material having a higher thermal coefficient of expansion than the electrode element. Next, the biasing element and the electrode element are cooled, inducing stresses in the membrane due to differences in the thermal coefficients of expansion. The moveable membrane curls because the polymeric biasing element shrinks faster than the electrode layer.

Additionally, providing differential thermal coefficients of expansion between the biasing element layers and the electrode element layer can create bias. Assuming an increase in temperature, the moveable membrane will curl toward the layer having the lower thermal coefficient of expansion because the layers accordingly expand at different rates. As such, the moveable membrane having two layers with different thermal coefficients of expansion will curl toward the layer having a lower thermal coefficient of expansion as the temperature rises. In addition, two polymer film layers having different thermal coefficients of expansion can be used in tandem with an electrode layer to bias the moveable membrane as necessary.

The layers of the moveable membrane 60 generally overlie the substrate electrode 40 and the aperture 70. Known integrated circuit manufacturing processes are used to construct the layers comprising moveable membrane 60. The moveable membrane is comprised of an electrode element and a biasing element. Preferably, one or more layers of the moveable membrane comprise the electrode element and one or more additional layers comprise the biasing element. As shown in FIG. 1, one preferred embodiment of the moveable membrane comprises an electrode element layer 62 positioned between two biasing element layers 64 and 66. It is also possible to configure the moveable membrane with an electrode element layer having only one biasing layer positioned on either side of the electrode element layer. The biasing element layer may also serve as an insulator that allows for the complete electrical isolation between the substrate electrode and the electrode element of the moveable membrane.

Preferably, at least one of the layers comprising the moveable membrane is formed from a flexible material, for instance flexible polymers (i.e. the biasing element) and/or flexible conductors (i.e. the electrodes) may be used. In a preferred embodiment the biasing element will comprise a flexible polymer film used to hold the moveable membrane in a stationary position absent electrostatic forces. In those applications in which the biasing element contacts the substrate to form the valve seal it is preferred that the biasing element comprise a resiliently compressible material. The resiliently compressible nature of the biasing element layer will allow for the valve seal to deform upon contact with the underlying substrate structure. The deforming characteristic of the contacting biasing element surface provides for a sound valve seal to form, thus providing for improved off-flow. A polymer film material that has resiliently compressible characteristics may include a polyimide material, however, other suitable flexible polymers having resilient characteristics and capable of withstanding the release layer etch process can also be employed. In one embodiment both the substrate dielectric layer and the biasing element layer of the moveable membrane are formed of a resiliently compressible material, such as a polyimide material.

The use of polyimide materials in the moveable membrane has been shown to withstand the pressure generated across the aperture that the membrane is intended to seal. Additionally, the strength of polyimide materials has shown to be resistant to rupturing or blistering even after prolonged use. Calculations have shown that the deflection of a polyimide membrane over a hole having a circumference of 80 micrometers with a pressure difference of 300 psi is approximately 0.064 micrometers for a 3 micrometer membrane and 0.22 micrometers for a 2 micrometer membrane. These calculations do not take into account the electrode element layer that will invariably further limit the amount of deflection of the overall moveable membrane.

The electrode element 62 of the moveable membrane 60 preferably comprises a layer of flexible conductor material. The electrode element may be deposited directly upon the uppermost planar surface of the substrate construct and the release layer or over an optional first biasing layer (i.e. polymer film), as needed. The electrode element preferably comprises gold, although other conductors tolerant of release layer processing and other flexible materials, such as conductive polymer film, may be used. The surface area and/or configuration of the electrode element can be varied as required to allow for the desired electrostatic forces to operate the MEMS valve device. By shaping the electrode element in a predetermined fashion it is possible to effectuate changes in the valve release rate. If gold is used to form the electrode element, a thin layer of chromium may be deposited onto the electrode element to allow better adhesion of the gold layer to the adjacent materials, such as to one or more biasing layers of flexible polymer film or the like.

The number of layers, thickness of layers, arrangement of layers, and choice of materials used in the moveable membrane may be selected to bias the moveable membrane as required. In particular, the distal portion can be varyingly biased as it extends from the fixed portion. The biased position of the distal portion can be customized individually or collectively to provide a desired separation from the underlying planar surface and the substrate electrode. For example, the distal portion can be biased to remain parallel to the underlying planar surface. Alternatively, the distal portion can be biased to alter the separation from the underlying planar surface by curling toward or curling away from the underlying planar surface. Preferably, the distal portion biased to curl away from the underlying substrate and alter the separation therefrom. Those skilled in the art will appreciate that more than one polymer film layer may be used, and that the films may be deposited on either side or both sides of the electrode elements.

When a voltage is applied between the electrode element of the moveable membrane and the substrate electrode, the electrostatic force between the electrode attracts the flexible electrode element towards the substrate, unrolling the moveable membrane to effectuate coverage of the aperture. The close proximity of the two electrodes when the valve is closed results in a strong electrostatic force. This strong electrostatic force results in a valve seal having a low leakage rate. When the voltage is removed from the electrodes, the stress in the film causes the flexible electrode to curl away from the substrate and open the valves. In the open position, since the portion of the membrane that covers the aperture is a relatively large distance from the substrate, large flows through the aperture can be realized without flow restrictions.

The valve can be configured so that a pressure difference can be applied in either direction across the membrane when the membrane seals the aperture. If the pressure is coming from the backside of the substrate and pushing up against the membrane when the valve is closed, then the pressure will assist in the re-curling of the film when the voltage is removed. If, however, the pressure is coming from the frontside of the substrate and pushing down against the membrane when it is closed, the stress in the membrane will have to work against the applied pressure to open the valve. This pressure build-up can be minimized by providing for a small aperture through the substrate proximate the end of the distal portion of the moveable membrane. Since the stress required to curl up the membrane will be proportional to the overall width of the membrane, the curling stress can be increased in comparison to the pressure exerted at the small pressure-relieving aperture by providing for this small aperture. Once the small pressure-relieving aperture has been opened, the pressure differential across the membrane at the valve aperture will be reduced, making it easier for the stress in the membrane to open the valve. An example of such a pressure-relieving aperture 102 is shown in FIGS. 1 and 2.

Figure 3:
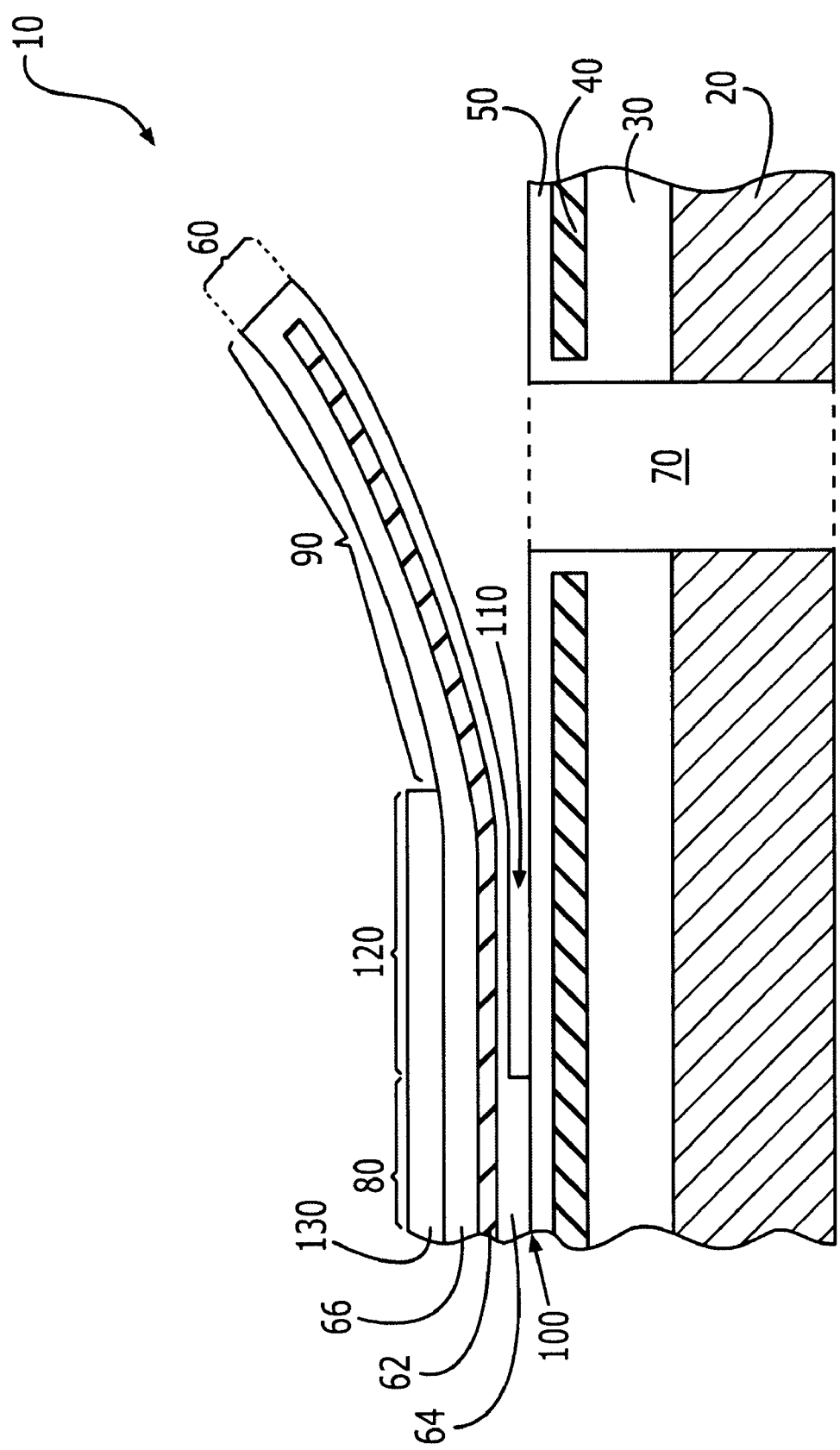
FIG. 3 is a cross-sectional view of a MEMS electrostatic valve having an air gap between the substrate and the moveable membrane in accordance with an embodiment of the present invention.

FIG. 3 illustrates a cross-sectional view of an alternative embodiment of the MEMS electrostatic valve in accordance with the present invention. The MEMS electrostatic valve 10 of this embodiment has a characteristically uniform air gap 110 underlying a medial portion 120 of the moveable membrane 60. The medial portion of the moveable membrane is defined as the horizontal region between the fixed portion 80 and the distal portion 90. A release layer (not shown in FIG. 3) is deposited on the uppermost layer of the substrate construct in the area underlying the medial and distal portions of the moveable membrane. The release layer is subsequently removed and results in the overall spatial separation between the medial and distal portions of the membrane and the underlying substrate.

The medial portion is constructed generally similar in make-up to the distal portion and, therefore, the differential in thermal coefficients of expansion between the electrode element and the biasing element cause the medial portion to exhibit curling. The curling nature of the moveable membrane is desired for the distal portion, but is generally undesirable for the medial portion. It is important to provide for a predictable medial portion, and thus a predictable air gap, because predictability lends itself to improved operating voltage characteristics. To alleviate the tendency for the medial portion to curl, a bias control layer 130 is typically provided for that overlies the fixed and medial portions of the moveable membrane and structurally constrains the medial portion. Typically, the bias control layer will overlay the fixed and medial portion of the membrane and extend outward, over the sides of the membrane, in order to allow for the bias control layer to be anchored to the substrate. The biasing control layer can be formed from a metallic material and will generally have a thermal coefficient of expansion that differs from the underlying membrane materials so as to hold the medial portion in a stationary position. The biasing control layer may be a generally solid layer, or it may comprise, lines, grids, cross-hatchings, or other patterns as required to support the medial portion and control the shape of the air gap.

Alternatively, the medial portion 120 of the moveable membrane 60 can be restrained during release by implementing tabs 104 (shown in the plan view perspective of FIG. 2) on the moveable membrane at the fixed portion 80. The tabs, which are typically extensions of the layers that comprise the membranes, provide an added holding force to insure that a uniform air gap is provided for under the medial portion. The tabs may be formed from one or more layers that comprise the moveable membrane.

Figure 4:
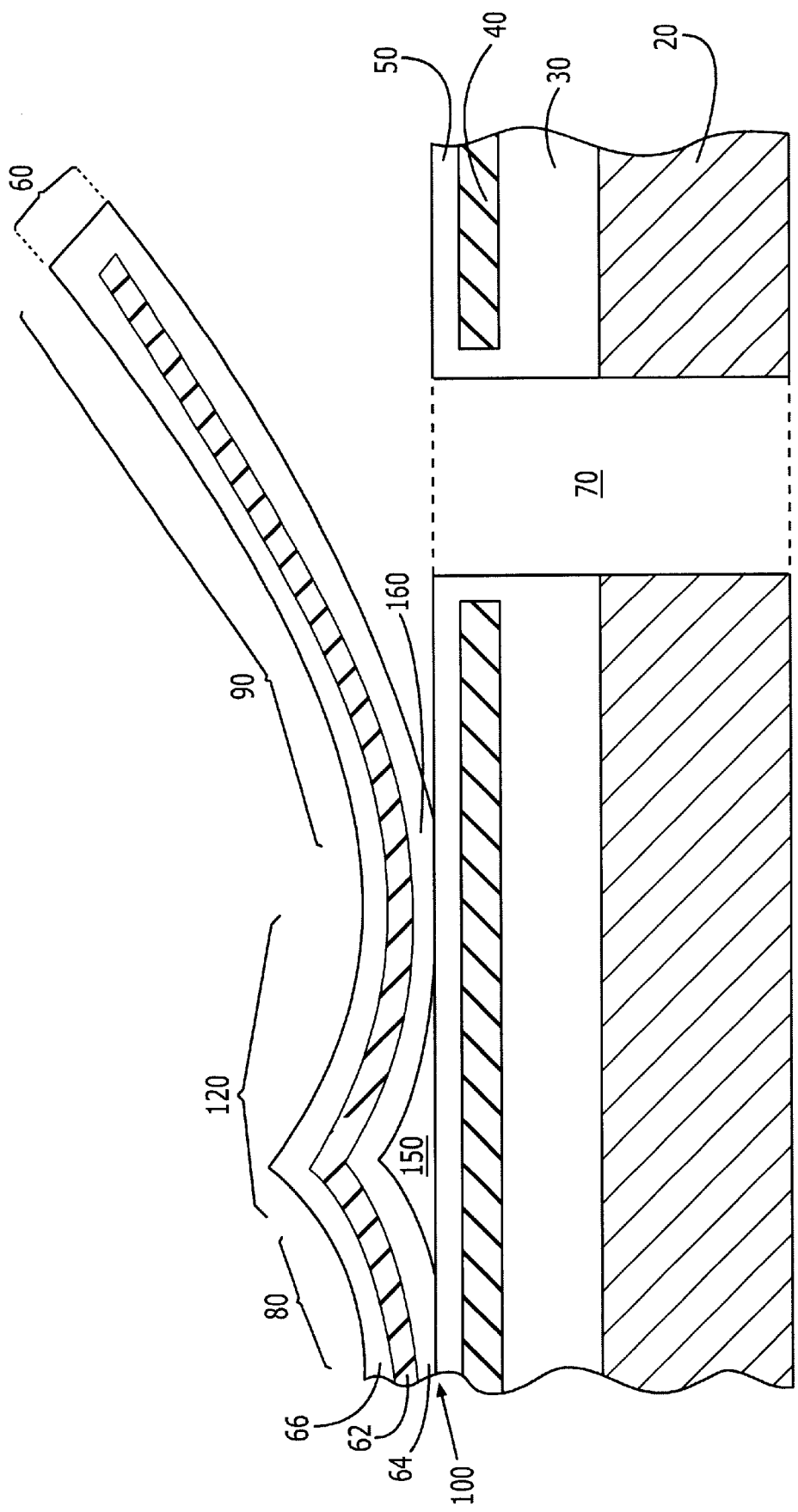
FIG. 4 is a cross-sectional view of a MEMS electrostatic valve having a decreasing air gap between the substrate and the moveable membrane in accordance with an embodiment of the present invention.

FIG. 4 illustrates a cross-sectional view of yet another alternative embodiment of the MEMS electrostatic valve in accordance with the present invention. The MEMS electrostatic valve 10 of this embodiment has a characteristic decreasing air gap 150 underlying a medial portion 120 of the moveable membrane 60. In this embodiment the cantilevered portion slopes downward until it contacts the underlying substrate construct at which point the moveable membrane transitions into the distal portion and the membrane curls away from the underlying planar surface. By way of example, the sloping medial portion may be fabricated by patterning the biasing layer so as to effect a thin region at the inflection area 160 or patterning the sloping region of the medial portion to cause the medial portion to slope toward the substrate.

By predefining the shape of the air gap, recently developed MEMS electrostatic devices can operate with lower and less erratic operating voltages. Further discussion of recently development MEMS electrostatic devices having predefined air gaps is being omitted from this disclosure so as not to overcomplicate the present invention. For an example of a recently developed improved MEMS device, see U.S. patent application Ser. No. 09/320,891, entitled "Micromachined Electrostatic Actuator with Air Gap" filed on May 27, 1999, in the name of inventor Goodwin-Johansson and assigned to MCNC, the assignee of the present invention. That application is herein incorporated by reference as if set forth fully herein.

Figure 5:
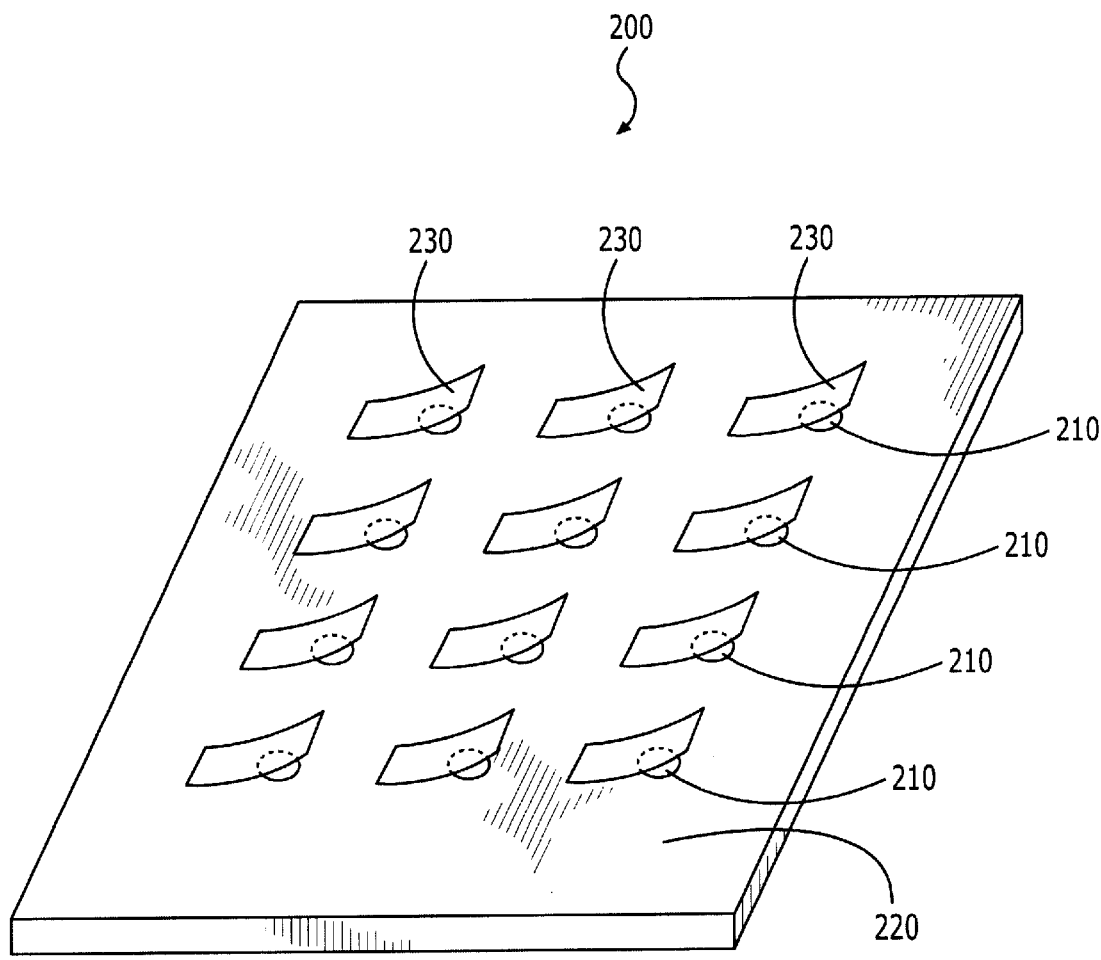
FIG. 5 is a perspective view of a MEMS electrostatic valve array having individual moveable membranes associated with array apertures in accordance with an alternate embodiment of the present invention.
Figure 6:
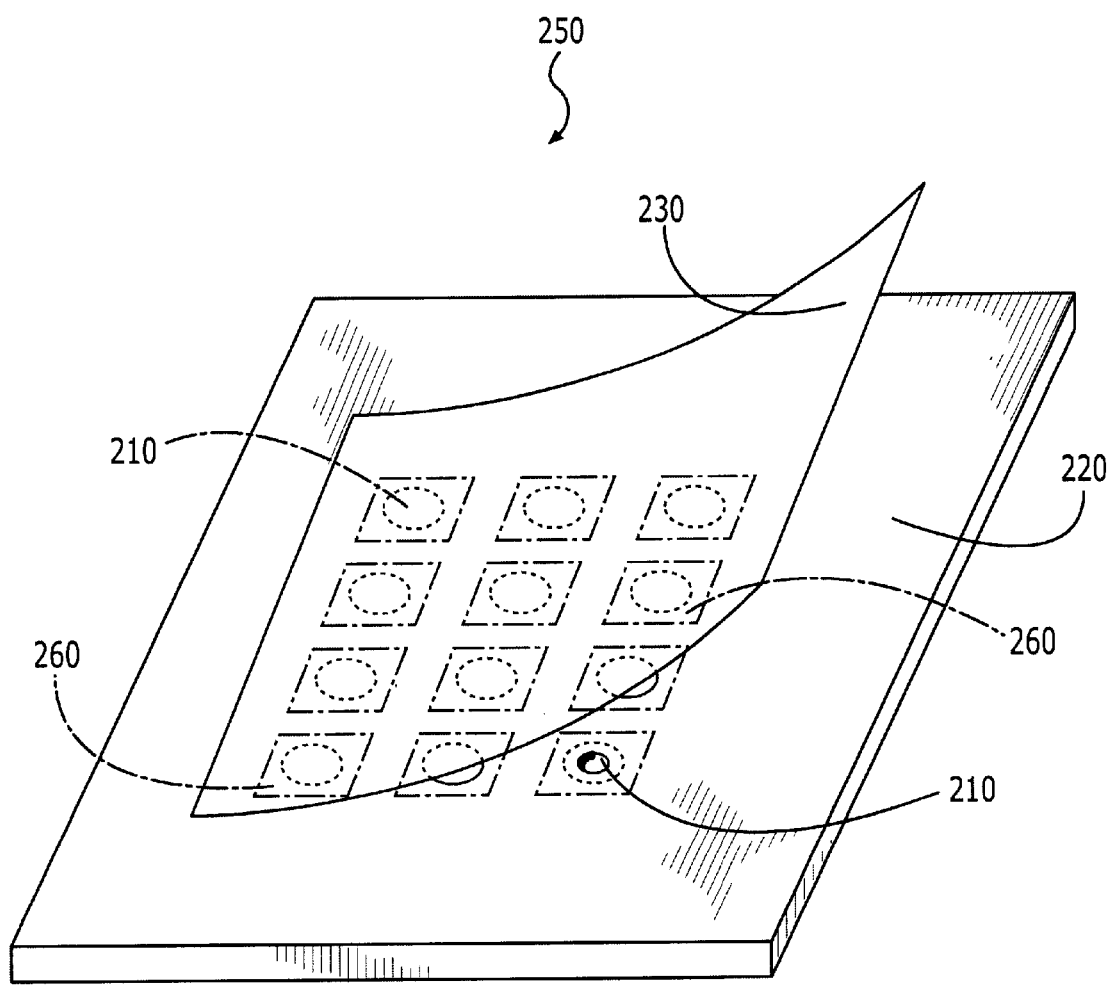
FIG. 6 is a perspective view of a MEMS electrostatic valve array having individual substrate electrodes associated with array apertures in accordance with an alternate embodiment of the present invention.
Figure 7:
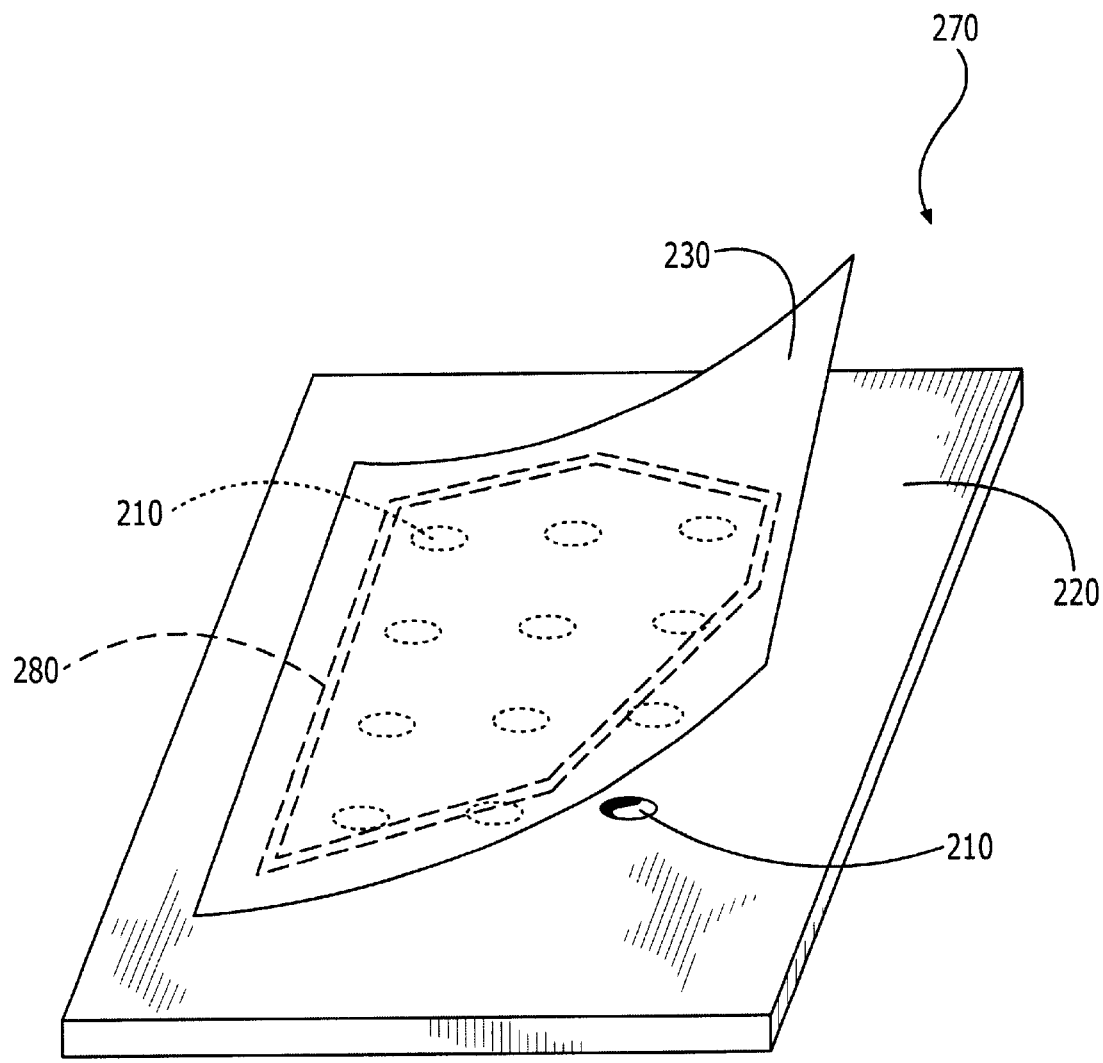
FIG. 7 is a perspective view of a MEMS electrostatic valve array having a shaped electrode element within the moveable membrane in accordance with an alternate embodiment of the present invention.

Increased gas or liquid flows can be achieved by creating an array of apertures defined with a single substrate. FIGS. 5–7 illustrate perspective views of various MEMS electrostatic valve arrays in accordance with further embodiments of the present invention. FIG. 5 is a MEMS valve array 200 wherein apertures 210 are defined within the substrate 220 in a predetermined arrangement and each valve aperture has a corresponding moveable membrane 230. By selectively addressing electrode elements within the individual membranes variable flow rates can be obtained by controlling the number of valves-opened and closed.

FIG. 6 is a MEMS valve array 250 wherein apertures 210 are defined within the substrate 220 in a predetermined arrangement and each valve aperture has a corresponding fixed substrate electrode disposed on the substrate. By selectively addressing the fixed substrate electrodes 260 within the substrate variable flow rates can be obtained by controlling the number of valves opened and closed. With a single large moveable membrane 230 this will typically involve supplying voltage to a row(s) of apertures. Rows in this context are defined as lines of apertures running perpendicular to the lengthwise direction of the moveable membrane. For example if electrostatic voltage is supplied to the substrate electrodes associated with the row of apertures nearest the fixed portion of the valve structure, the moveable membrane will be pulled down to seal-off these apertures and the remaining distal portion of the membrane will maintain a curled position. Additionally, an array of this nature may provide for the rows of apertures to be canted, at a slight angle, with respect to the underlying rows of substrate electrodes to provide for a greater degree of variable flow as opposed to step-like changes in flow. It is also possible and within the inventive concepts herein disclosed to configure an array that combines the individual membranes of the FIG. 5 embodiment with the individual substrate electrodes of the FIG. 6 embodiment.

FIG. 7 is a MEMS valve array 270 wherein apertures 210 are defined within the substrate 220 in a predetermined arrangement and the moveable membrane 230 has a shaped electrode element 280 (outlined in FIG. 7 by the broken double lines) that allows for the amount of membrane uncurling to be proportional to the amount of voltage supplied to the electrode element. In this regard, supplying full voltage to the electrode element will cause the moveable membrane to fully uncurl thus sealing-off all valves in the array. In instances where less than full voltage is supplied the membrane may uncurl partially, thus sealing-off only those valves underlying the uncurled portion of the membrane. The shape of the electrode element is shown by way of example. The shape of the electrode element will be predetermined based upon size of the moveable membrane, size of the array and the configuration of the array. Alternately, the shaped electrode can be the substrate electrode. Shaping the substrate electrode, as opposed to the membrane electrode, may be preferred to insure uniform curl in the moveable membrane.

Additionally, the present invention provides for a method of making a MEMS valve device driven by electrostatic forces. FIGS. 8–11 illustrate various stages in the fabrication of the MEMS electrostatic valve, in accordance with a method of making embodiment of the present invention. This method, in which initial aperture formation commences prior to the valve construction and is completed after valve construction, has the advantage of allowing the alignment between the aperture and the surrounding substrate electrode to be performed on the frontside of the substrate construct. Since the moveable membrane needs to be formed so that it overlies the aperture, the final opening of the aperture will be completed after the formation of the membrane. The thin film nature of the fabrication technology requires that the build surfaces be generally flat prior to forming the substrate electrode and the flexible electrode element of the membrane.

Figure 8:
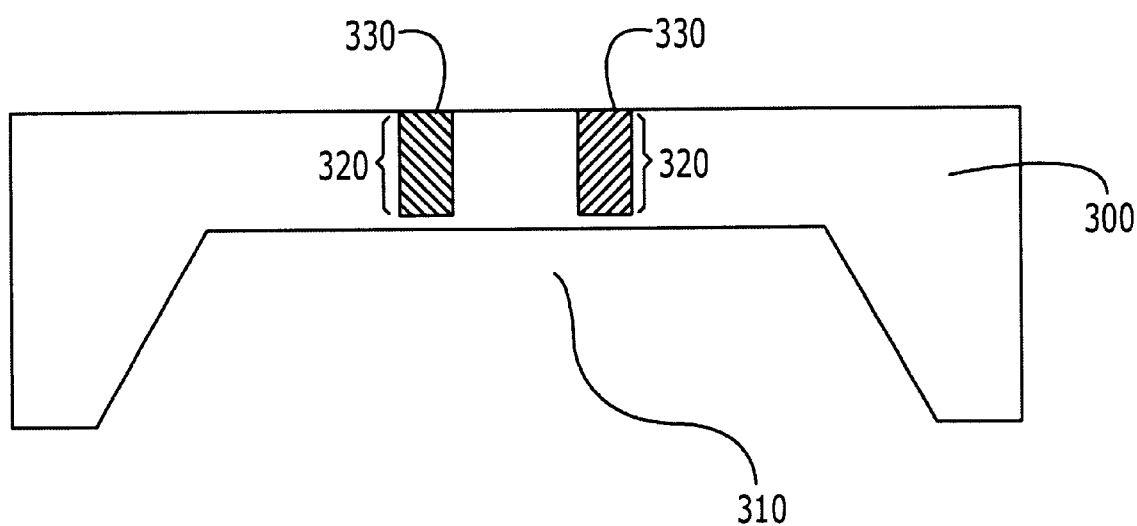
FIGS. 8–11 are cross-sectional views of a MEMS valve construct during various stages of fabrication in accordance with a method for making embodiment of the present invention.

FIG. 8 is an illustration of a cross-sectional view of a substrate 300 that has undergone backside etch to define a large cavity 310 and front side etch to define valve apertures 320. Initially, a large cavity may be defined in the backside of the substrate. Typically, a conventional wet etch process will be used to form the large cavity. The large cavity, typically, results in thinning the substrate down to approximately 50 micrometers, although other desirable thicknesses are also possible. The large cavity etch process is an optional process that provides for minimization of flow restrictions and simplifies the subsequent formation of the valve apertures. After the large cavity is formed, the valve apertures are etched partially through the frontside of the substrate. Typically a reactive ion etch (RIE) process will used to perform the precision etching required of the valve apertures. A sacrificial plug material 330 is then disposed in the apertures to facilitate a continuous substrate layer upon which the valve can be constructed. The sacrificial plug material will typically comprise copper or any other suitable material may be used as the sacrificial plug material. Once the plug material has been disposed, it is typically subjected to a polishing procedure to assure planarization of the surface and ready the substrate for valve construction.

Figure 9:
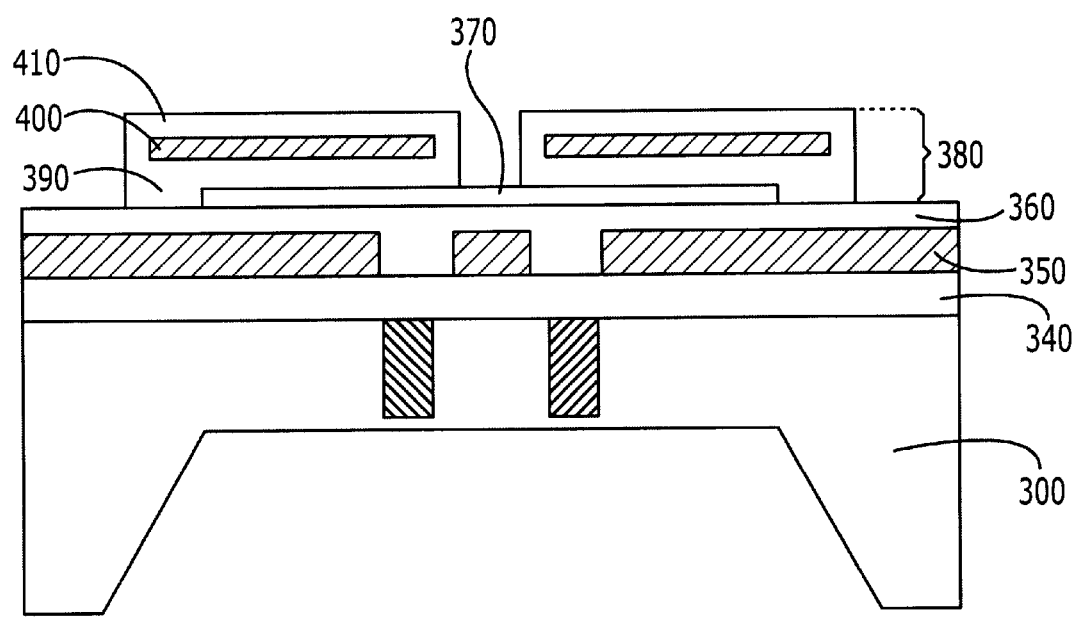

FIG. 9 depicts a cross-sectional view of the MEMS valve construct after the valve structure has been formed on the frontside surface of the substrate. Typically, the formation of the valve structure will include disposing an insulator layer 340 on the substrate; disposing, patterning and etching a substrate electrode layer 350 on the insulator layer; and disposing a dielectric layer 360 on the substrate electrode layer. The formation of these layers is followed by the formation of a release layer 370, typically an oxide that will subsequently be removed to facilitate release of a portion of the membrane from the substrate. The membrane 380 is then disposed on the release layer and anchored to the substrate via the dielectric layer. In the embodiment shown, the membrane comprises a first biasing element/dielectric layer 390 disposed on the release layer and the dielectric layer, an electrode element layer 400 disposed on the first biasing element/dielectric layer and a second biasing element layer 410 disposed on the electrode. These valve construct layers and fabrication steps are shown by way of example, other layering sequences are possible and within the inventive concepts herein disclosed. The surfaces that will eventually form the valve seat and the valve cover may be textured surfaces to allow for the MEMS device to overcome common release problems related to stiction. In the embodiment shown it may be desirable to texture the dielectric layer 360 and/or the first biasing element/dielectric layer 390. The texturing of these surfaces can be accomplished in conjunction with the deposition and removal of the release layer. The process of texturing a surface on a MEMS device is well known by those of ordinary skill in the art.

Figure 10:
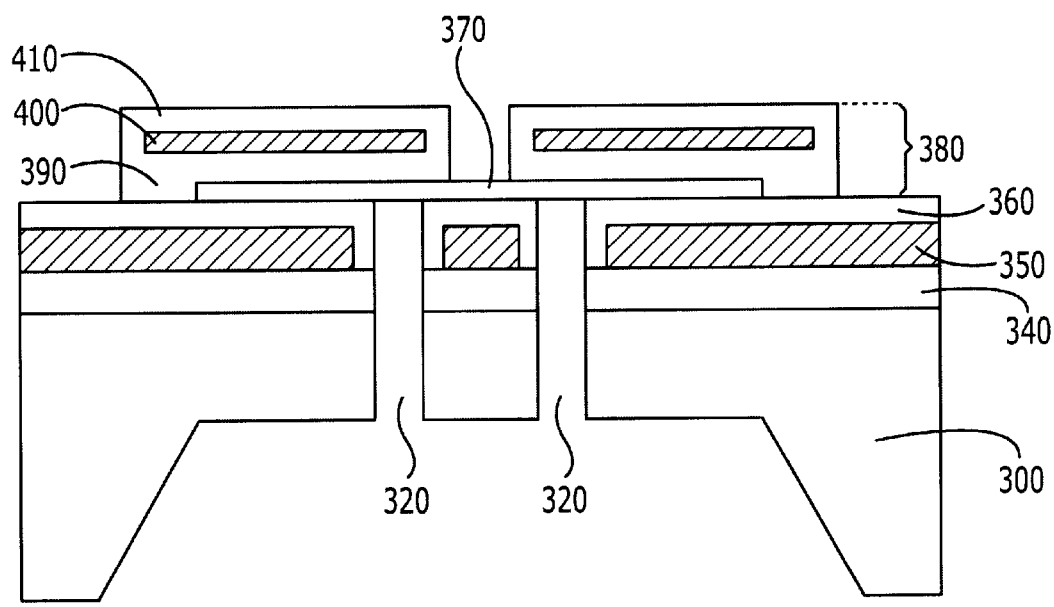
Figure 11:
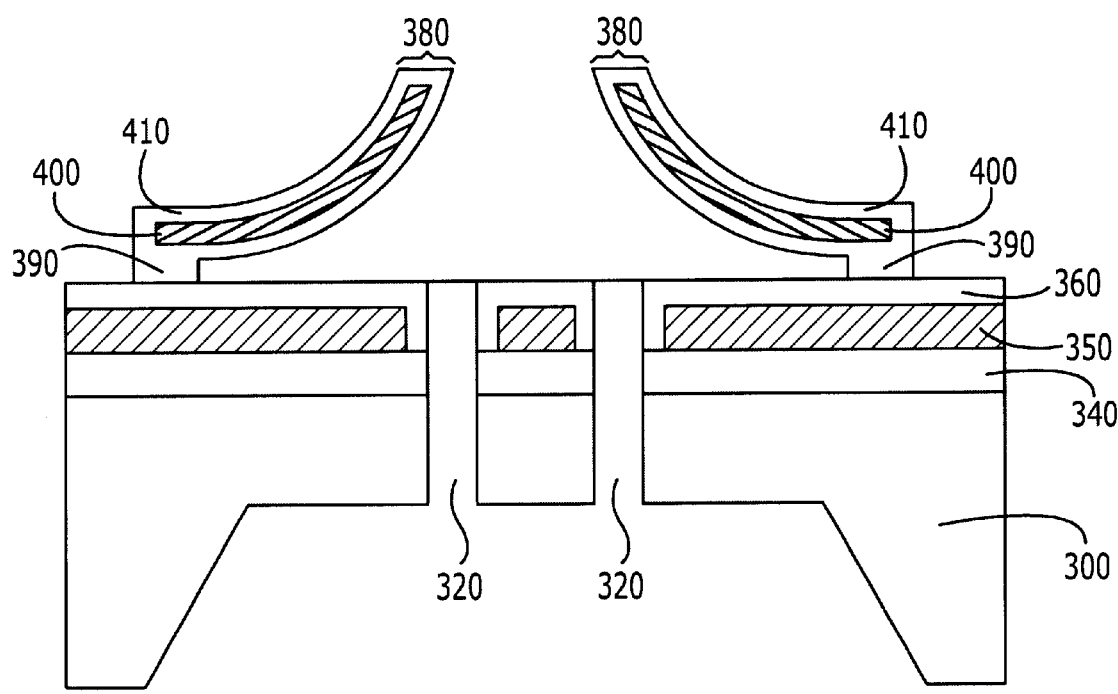

FIG. 10 illustrates a cross-sectional view of the MEMS valve construct after the backside of the substrate has been etched to expose the plug material, the plug material is removed and the aperture 320 has been etched to expose the release layer. The backside etch of the substrate is typically performed with a wet etch process. Once the etch process exposes the backside of the sacrificial plug material, the plug is removed by performing an etch process. Typically, the plug material will be removed by a conventional wet etch process. After the plug material has been removed, the aperture is furthered formed into the valve construct up to the release layer 370. A reactive ion etch process will, typically, be used to further form the aperture and insure that the aperture has precision facings. FIG. 11 shows the completed MEMS valve construct after the release layer has been removed, thus, allowing for the distal portion of the membrane to be released from the substrate.

This method, in which initial aperture formation commences prior to the valve construction and is completed after valve construction, has the advantage of allowing the alignment between the aperture and the surrounding substrate electrode to be performed on the frontside of the substrate construct.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limiting the scope of the present invention in any way.

That which is claimed:

1. A MEMS (Micro Electro Mechanical System) valve driven by electrostatic forces, comprising:

a substrate defining a generally planar surface having an aperture therethrough;

a substrate electrode disposed upon said substrate;

a non-hinged, moveable membrane generally overlying said substrate electrode and said aperture, the membrane comprising an electrode element and a biasing element, wherein the moveable membrane includes a fixed portion attached directly to the generally planar surface of said substrate and a flap-like distal portion extending from the fixed portion, the distal portion being biased to at least partially curl in a non-actuated state and moveable with respect to said substrate electrode; and at least one resiliently compressible dielectric layer disposed between said substrate electrode and said membrane electrode element, wherein said moveable membrane responds to a voltage differential established between said substrate electrode and said moveable membrane electrode to move said membrane toward said aperture to seal said aperture so as to prevent flow therethrough.

2. The MEMS valve of claim 1, wherein said at least one resiliently compressible dielectric layer comprises a first resiliently compressible dielectric layer disposed on said substrate electrode, wherein said substrate, said substrate electrode and said first resiliently compressible dielectric layer cooperate to define the aperture therethrough and said first resiliently compressible dielectric layer defines a valve seat.

3. The MEMS valve of claim 2, wherein said first resiliently compressible dielectric layer comprises a textured valve seat surface, wherein the textured valve seat surface facilitates release of the moveable membrane during valve operation.

4. The MEMS valve of claim 2, wherein said first resiliently compressible dielectric layer comprises a polyimide material.

5. The MEMS valve of claim 1, wherein said at least one resiliently compressible dielectric layer is a first resiliently compressible dielectric layer disposed on said moveable membrane and defines a surface that acts as a valve seal.

6. The MEMS valve of claim 5, wherein said first resiliently compressible dielectric layer comprises a textured valve seal surface, wherein the textured valve seal surface facilitates release of the moveable membrane during valve operation.

7. The MEMS valve of claim 5, wherein said first resiliently compressible dielectric layer comprises a polyimide material.

8. The MEMS valve of claim 1, wherein said at least one resiliently compressible dielectric layer comprises a first resiliently compressible dielectric layer disposed on said substrate and a second resiliently compressible dielectric layer disposed on said moveable membrane, wherein the first resiliently compressible dielectric layer defines a valve seat and the second resiliently compressible dielectric layer defines a valve seal.

9. The MEMS valve of claim 8, wherein said first resiliently compressible dielectric layer comprises a textured valve seat surface and said second resiliently compressible dielectric layer comprises a textured valve seal surface, wherein the textured valve seal surface and the textured valve seat surface facilitate release of the moveable membrane during valve operation.

10. The MEMS valve of claim 8, wherein said first and second resiliently compressible dielectric layers comprise polyimide materials.

11. The MEMS valve of claim 1, wherein said aperture is generally cylindrical in shape.

12. The MEMS valve of claim 1, wherein said aperture is generally funnel-like in shape, having a smaller radius nearest the moveable membrane and a larger radius nearest the backside of the substrate.

13. The MEMS valve according to claim 1, wherein said biasing element comprises at least one polymer film layer.

14. The MEMS valve according to claim 1, wherein said biasing element comprises two polymer film layers deposited on opposite sides of an electrode layer comprising said electrode element.

15. The MEMS valve according to claim 1, wherein said electrode element and said biasing element have different thermal coefficients of expansion.

16. The MEMS valve according to claim 1, wherein said biasing element comprises at least two polymer films of different thickness.

17. The MEMS valve according to claim 16, wherein said at least two polymer films of different thickness comprise a first polymer film having a thinner thickness deposited on a surface of the electrode element nearest said substrate and a second polymer film having a thicker thickness deposited on a surface of the electrode element furthest from said substrate.

18. The MEMS valve device according to claim 1, wherein said biasing element comprises at least two polymer films of different coefficients of expansion.

19. The MEMS valve according to claim 1, wherein the distal portion of said moveable membrane is biased so as to curl away from said substrate when no electrostatic force is created between said electrode element and said substrate electrode.

20. The MEMS valve according to claim 1, further comprising a source of electrostatic energy electrically connected to at least one of said substrate electrode and said electrode element.

21. The MEMS valve according to claim 1, wherein said substrate further defines a pressure-relieving aperture that underlies said moveable membrane.

22. The MEMS valve according to claim 1 wherein said substrate and said substrate electrode cooperate to define the aperture therethrough.

23. A MEMS valve driven by electrostatic forces, comprising:
    a substrate having a generally planar surface;
    a first substrate dielectric layer disposed on the generally planar surface of said substrate;
    a substrate electrode disposed upon said first substrate dielectric layer;
    a second substrate dielectric layer disposed upon said substrate electrode and having a generally planar surface, wherein said substrate, said first substrate dielectric layer, said substrate electrode and said second substrate dielectric layer cooperate to define an aperture therethrough; and
    a non-hinged, moveable membrane generally overlying said substrate electrode and said aperture, the moveable membrane comprising a first biasing layer, a membrane electrode layer disposed on said first biasing layer and a second biasing layer disposed on said membrane electrode layer, wherein the moveable membrane includes a fixed portion attached directly to the generally planar surface of said second substrate dielectric layer and a flap-like distal portion extending from the fixed portion, the distal portion being biased to at least partially curl in a non-actuated state and moveable with respect to said substrate electrode,
    wherein said moveable membrane responds to a voltage differential established between said substrate electrode and said moveable membrane electrode to move said membrane toward said aperture to seal said aperture so as to prevent flow therethrough.

24. A MEMS valve array driven by electrostatic forces, comprising:
    a substrate that defines a generally planar surface having a plurality of apertures therethrough;
    a substrate electrode disposed upon said substrate;
    a moveable membrane generally overlying said substrate electrode and said plurality of apertures, the moveable membrane comprising an electrode element and a biasing element, wherein the moveable membrane includes a fixed portion attached directly to the generally planar surface of said substrate and a flap-like distal portion extending from the fixed portion, the distal portion being biased to at least partially curl in a non-actuated state and moveable with respect to said substrate electrode; and
    at least one dielectric layer disposed between said substrate electrode and said electrode element,
    wherein said moveable membrane responds to a voltage differential established between said substrate electrode and said moveable membrane electrode to move said membrane toward said plurality of apertures to thereby controllably adjust the quantity of the plurality of apertures sealed by said moveable membrane so as to prevent flow therethrough.

25. A MEMS valve array driven by electrostatic forces, comprising:
    a substrate that defines a generally planar surface having a plurality of apertures therethrough;
    a plurality of substrate electrodes disposed upon said substrate, wherein each substrate electrode has a corresponding aperture;
    a moveable membrane generally overlying said plurality of substrate electrodes and said plurality of apertures, the moveable membrane comprising an electrode element and a biasing element, wherein the moveable membrane includes a fixed portion attached directly to the generally planar surface of said substrate and a flap-like distal portion extending from the fixed portion, the distal portion being biased to at least partially curl in the non-actuated state and moveable with respect to said plurality of substrate electrodes; and
    at least one dielectric layer disposed between said substrate electrode and said electrode element,
    wherein said moveable membrane responds to a voltage differential established between one or more of said substrate electrodes and said electrode element to move said membrane toward said plurality of apertures to thereby controllably adjust the quantity of said plurality of apertures sealed by said moveable membrane so as to prevent flow therethrough.

26. The MEMS valve array of claim 25, wherein the plurality of apertures are positioned in rows that extend generally perpendicular to a lengthwise direction of the moveable membrane.

27. The MEMS valve array of claim 26, wherein the rows of apertures are generally canted at a predetermined angle with respect to the corresponding substrate electrode to provide variable flow.

28. A MEMS valve array driven by electrostatic forces, comprising:
    a substrate that defines a generally planar surface having a plurality of apertures therethrough, the plurality of apertures disposed in generally parallel, grid-like, formation;
    a substrate electrode disposed upon said substrate;
    a plurality of moveable membranes that each generally overlie a portion of said substrate electrode and a corresponding aperture of said plurality of apertures, each moveable membranes comprising an electrode element and a biasing element, wherein each moveable membrane includes a fixed portion attached directly to the generally planar surface of said substrate and a flap-like distal portion extending from the fixed portion, the distal portion being biased to at least partially curl in a non-actuated state and moveable with respect to said substrate electrode; and at least one dielectric layer disposed between said substrate electrode and said electrode element, wherein at least one moveable membrane responds to a voltage differential established between said substrate electrode and at least one electrode element to move said membrane toward said corresponding aperture to thereby controllably adjust the quantity of the plurality of apertures sealed by said moveable membranes so as to prevent flow therethrough.

* * * * *